United States Patent
Igarashi et al.

(10) Patent No.: US 12,368,017 B2
(45) Date of Patent: Jul. 22, 2025

(54) CHARGED PARTICLE BEAM APPARATUS AND FOCUS ADJUSTING METHOD THEREFOR

(71) Applicant: Hitachi High-Tech Corporation, Tokyo (JP)

(72) Inventors: Keisuke Igarashi, Tokyo (JP); Wei Chean Tan, Tokyo (JP); Mai Yoshihara, Tokyo (JP); Hiroyuki Chiba, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 448 days.

(21) Appl. No.: 18/007,588

(22) PCT Filed: Jun. 8, 2020

(86) PCT No.: PCT/JP2020/022503
§ 371 (c)(1),
(2) Date: Dec. 1, 2022

(87) PCT Pub. No.: WO2021/250733
PCT Pub. Date: Dec. 16, 2021

(65) Prior Publication Data
US 2023/0230798 A1    Jul. 20, 2023

(51) Int. Cl.
*H01J 37/21* (2006.01)
*H01J 37/20* (2006.01)
*H01J 37/22* (2006.01)

(52) U.S. Cl.
CPC .............. *H01J 37/21* (2013.01); *H01J 37/20* (2013.01); *H01J 37/222* (2013.01)

(58) Field of Classification Search
USPC ................................................. 250/306, 307
See application file for complete search history.

(56) References Cited

U.S. PATENT DOCUMENTS

2003/0006372 A1    1/2003  Morita et al.
2006/0231773 A1*  10/2006  Katagiri .................. H01J 41/12
                                                      250/492.1
(Continued)

FOREIGN PATENT DOCUMENTS

JP      2002-191060 A    7/2002
JP        2003-7243 A    1/2003
(Continued)

OTHER PUBLICATIONS

International Search Report (PCT/ISA/210) issued in PCT Application No. PCT/JP2020/022503 dated Aug. 4, 2020 with English translation (four (4) pages).
(Continued)

*Primary Examiner* — Kiet T Nguyen
(74) *Attorney, Agent, or Firm* — Crowell & Moring LLP

(57) ABSTRACT

A technique that enables automatic focus adjustment even for a sample having regions with different heights is proposed. A charged particle beam device according to the disclosure includes: a sample holder configured to hold a sample; a sample stage configured to move the sample; a charged particle gun and a charged particle beam column configured to irradiate the sample with a charged particle beam; an objective lens configured to perform focus adjustment by changing an intensity of a focusing effect on the charged particle beam; a detector configured to detect electrons from the sample and output a signal forming an electron image; an optical imaging device configured to capture an optical image of the sample; and a control device configured to calculate height information of the sample based on the optical image obtained by imaging the sample by the optical imaging device, and automatically set a focus adjustment value of an observation site based on the height information (see FIG. 5).

11 Claims, 7 Drawing Sheets

(56) References Cited

U.S. PATENT DOCUMENTS

2009/0212214 A1    8/2009  Kimba
2020/0027693 A1*   1/2020  Fang ...................... H01L 22/12

FOREIGN PATENT DOCUMENTS

JP    2006-310223 A    11/2006
JP     2016-11896 A     1/2016

OTHER PUBLICATIONS

Japanese-language Written Opinion (PCT/ISA/237) issued in PCT Application No. PCT/JP2020/022503 dated Aug. 4, 2020 with partial English translation (seven (7) pages).
Japanese-language International Preliminary Report on Patentability (PCT/IPEA/409) issued in PCT Application No. PCT/JP2020/022503 dated Dec. 25, 2020, including Annexes with partial English translation (15 pages).

* cited by examiner

[FIG. 1]
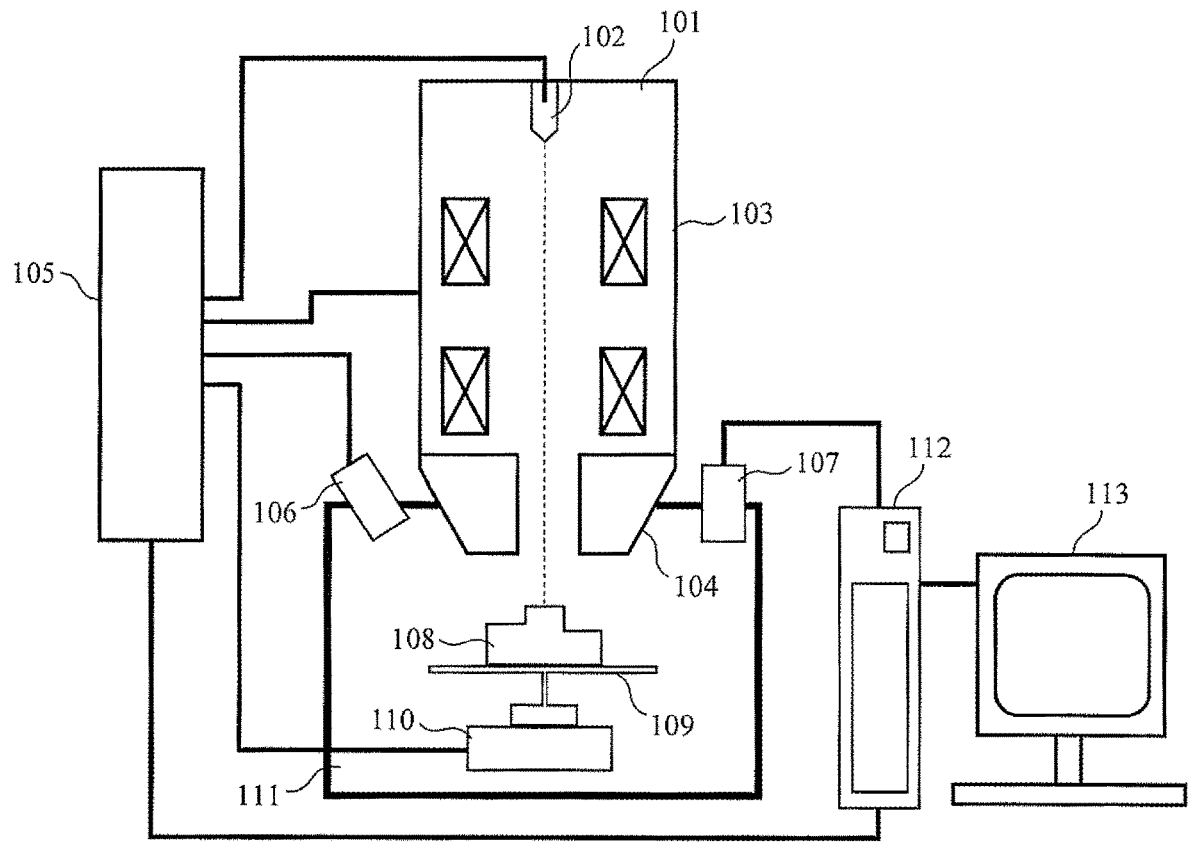
[FIG. 2]
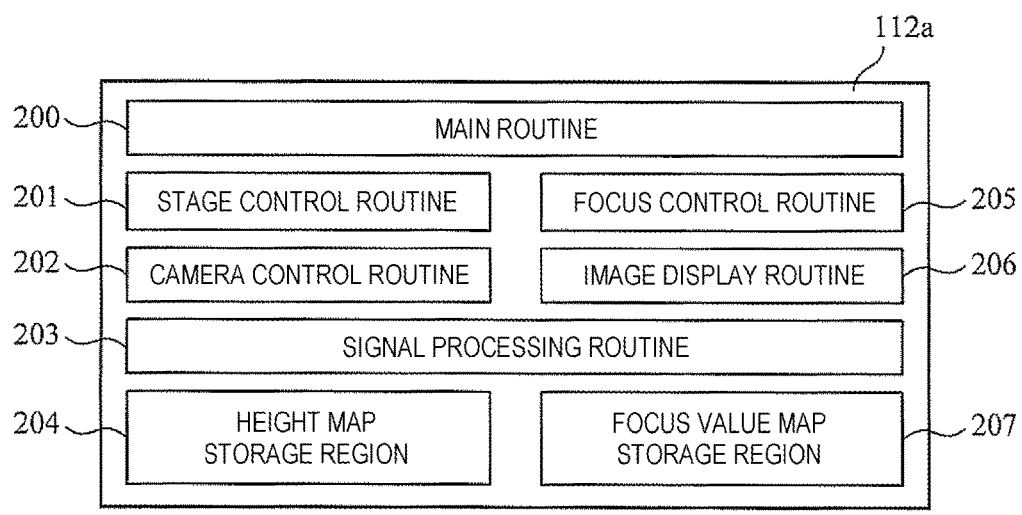

[FIG. 3]
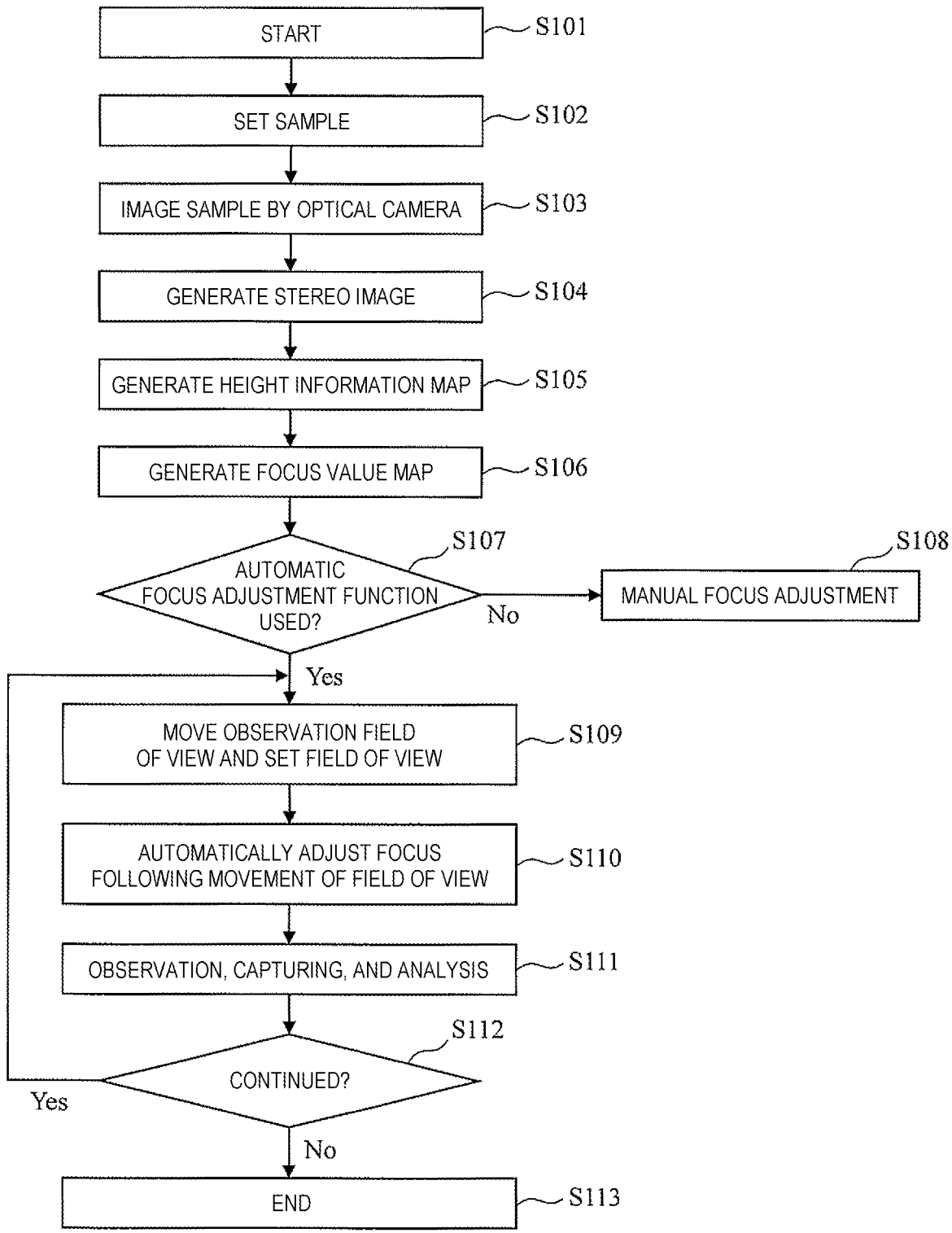

[FIG. 4]
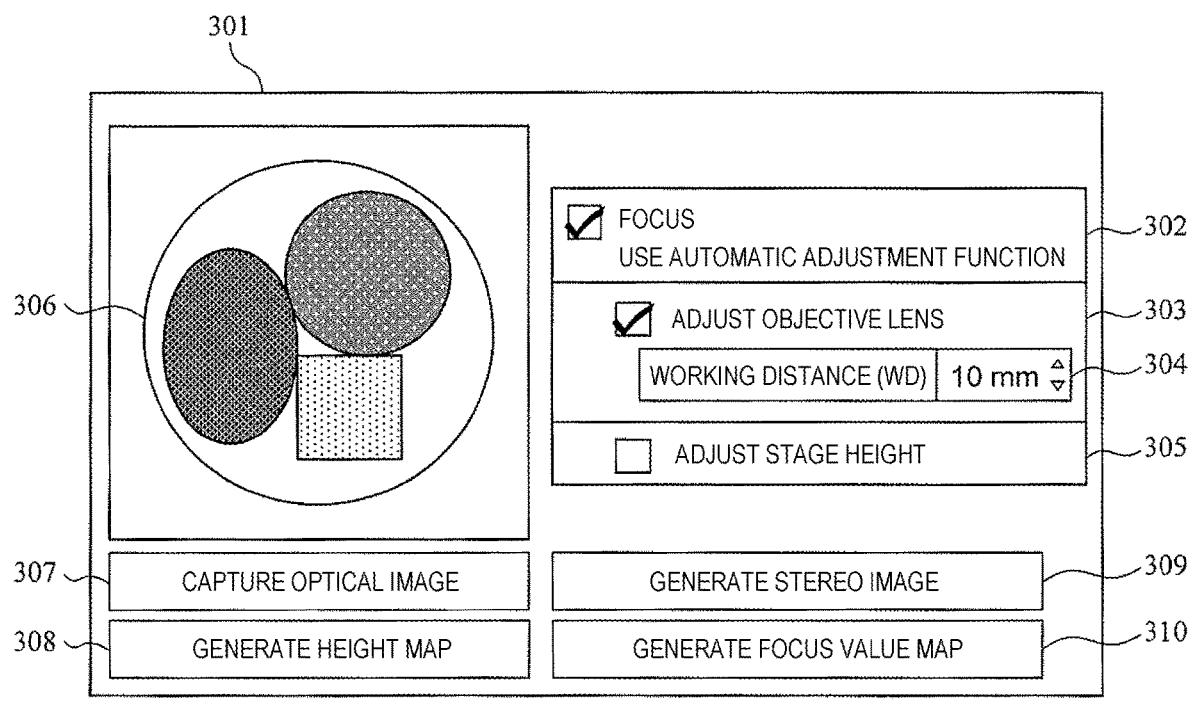

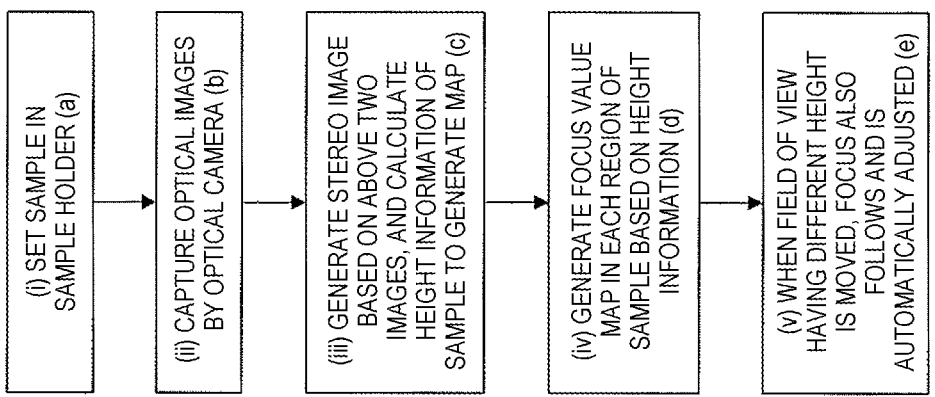
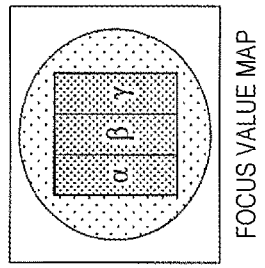
FIG. 5C
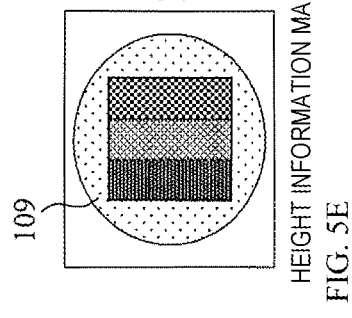
FIG. 5E
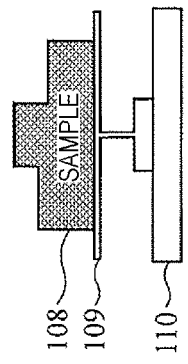
FIG. 5A
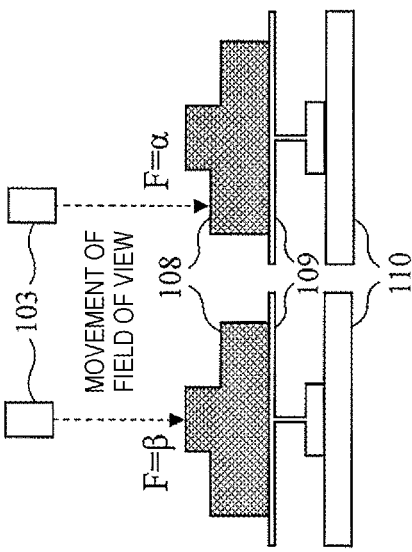
FIG. 5D
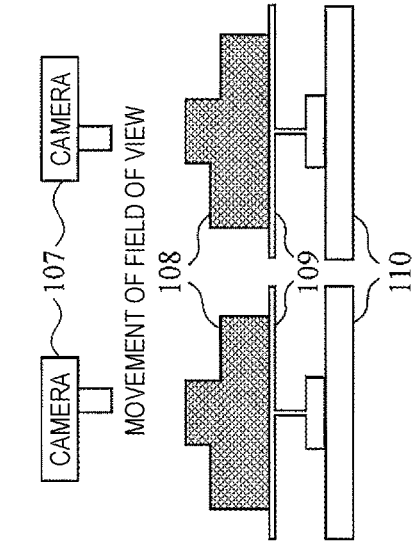
FIG. 5B

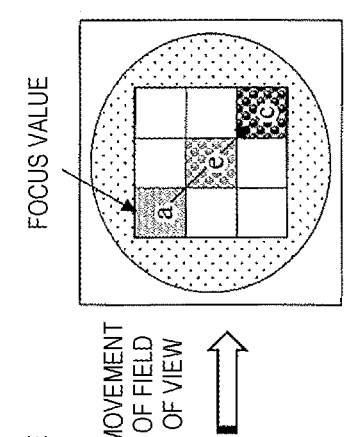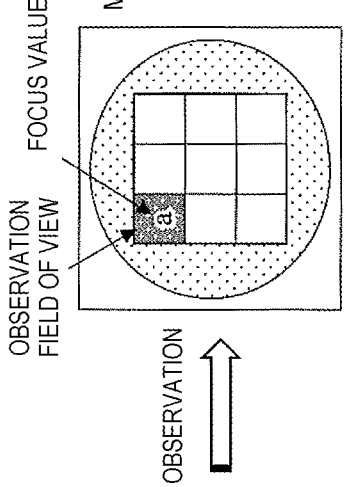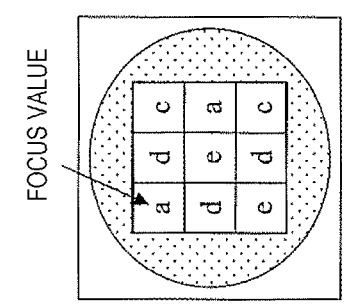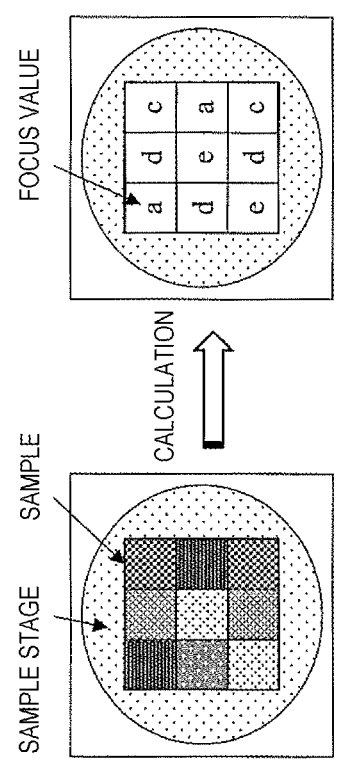

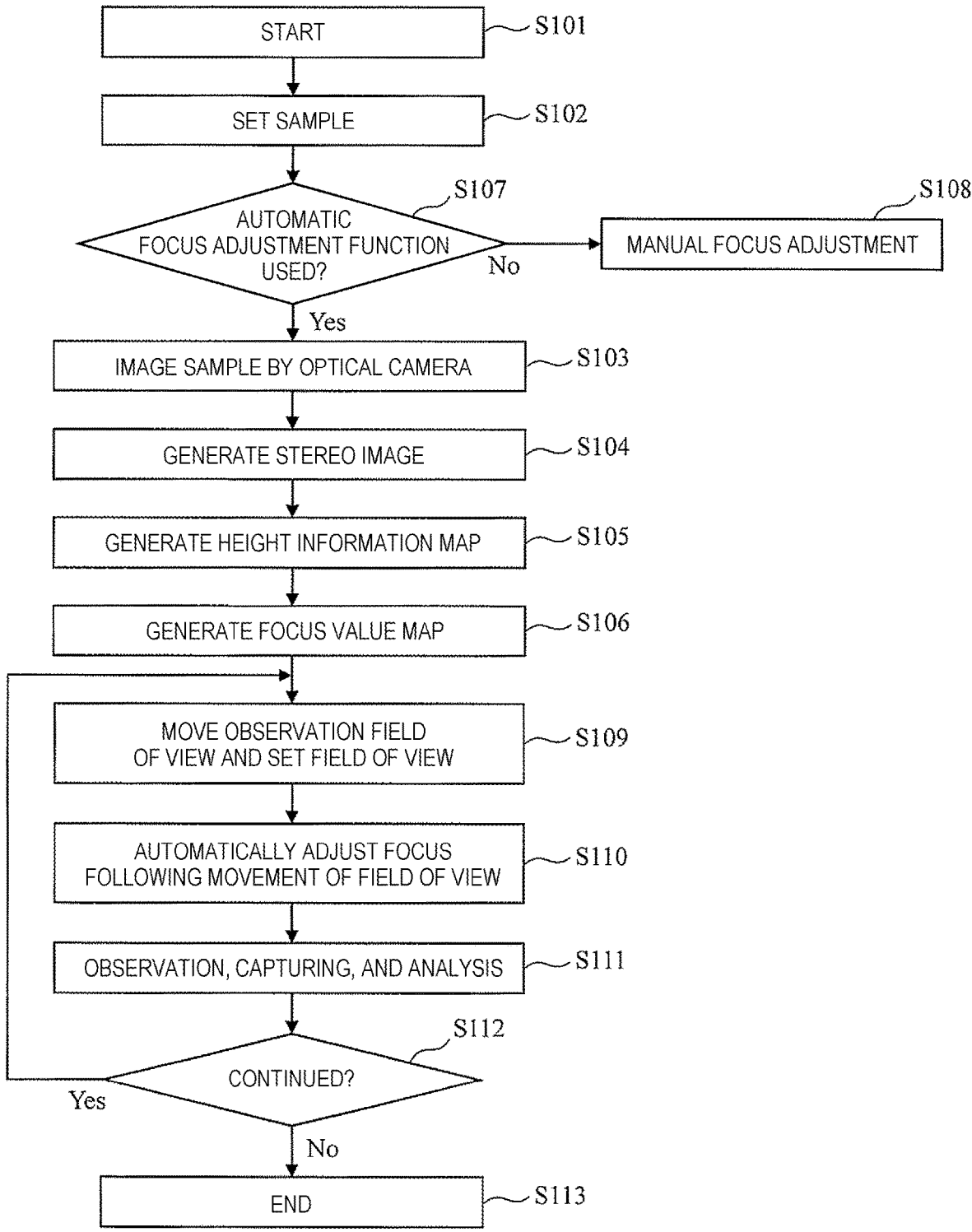
[FIG. 7]

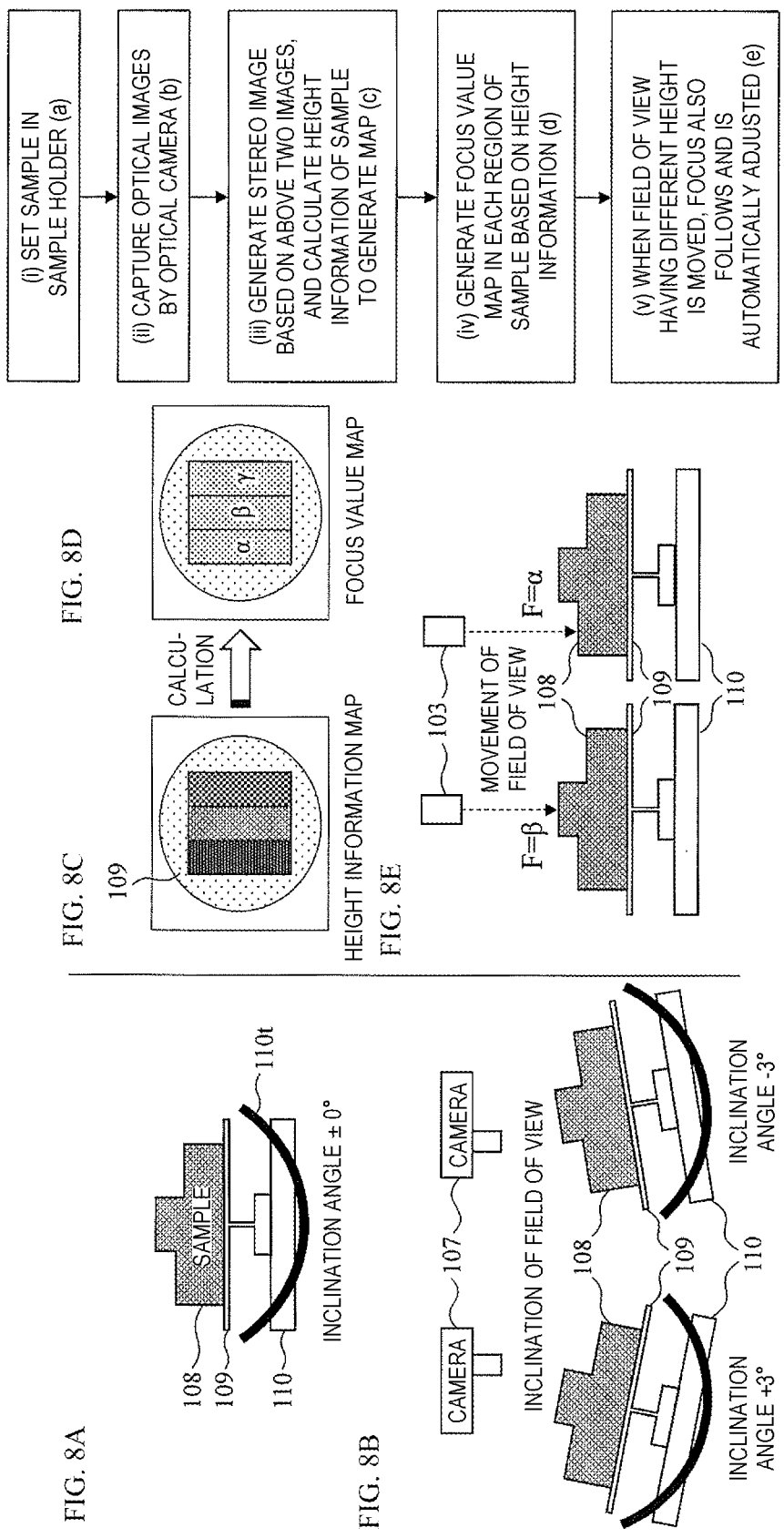

CHARGED PARTICLE BEAM APPARATUS AND FOCUS ADJUSTING METHOD THEREFOR

TECHNICAL FIELD

The present disclosure relates to a charged particle beam device and a focus adjustment method thereof.

BACKGROUND ART

A charged particle beam device represented by a scanning electron microscope, a transmission electron microscope, a focused ion beam device, and the like is a device capable of performing observation and processing by irradiating a sample with a charged particle beam and detecting, by a detector, transmitted, scattered, and reflected charged particles and secondary electrons generated from a sample surface. As compared with an optical microscope, the charged particle beam device provides remarkable advantages such as fairly high resolution and elemental analysis by detecting X-rays emitted from the sample. In order to perform sample observation using such a charged particle beam device, focus control of the charged particle beam on the sample is necessary. In this regard, for example, PTL 1 discloses a function capable of securing a state in which a focus point is aligned without taking time or labor when observing a particle defect using a scanning electron microscope.

CITATION LIST

Patent Literature

PTL 1: JP-A-2003-007243

SUMMARY OF INVENTION

Technical Problem

However, even in the charged particle beam device capable of automatic focus adjustment as disclosed in PTL 1, when a large sample having regions with different heights is observed and a field of view is moved to the regions with different heights, the charged particle beam (beam) is not focused. Therefore, it is often necessary for a user to manually adjust the focus every time the observation field of view is moved. The focus adjustment is a necessary work for use of the charged particle beam device. It is troublesome to perform the focus adjustment every time the field of view is moved, which hinders improvement of use efficiency and causes an increase in observation time. Further, it may be difficult for an inexperienced user who does not have specialized knowledge of the charged particle beam device to perform the focus adjustment, which hinders widespread use of the device for a wide range of users.

The disclosure proposes a technique that enables automatic focus adjustment even for a sample having regions with different heights.

Solution to Problem

In order to solve the above problem, the disclosure proposes a charged particle beam device including: a sample holder configured to hold a sample; a sample stage configured to move the sample; a charged particle gun and a charged particle beam column configured to irradiate the sample with a charged particle beam; an objective lens configured to perform focus adjustment by changing an intensity of a focusing effect on the charged particle beam; a detector configured to detect electrons from the sample and output a signal forming an electron image; an optical imaging device configured to capture an optical image of the sample; and a control device configured to calculate height information of the sample based on the optical image obtained by imaging the sample by the optical imaging device, and automatically set a focus adjustment value of an observation site based on the height information.

Further features related to the disclosure will become apparent from a description of the present specification and the accompanying drawings. In addition, aspects of the disclosure may be achieved and implemented using elements, combinations of various elements, the following detailed description, and the accompanying claims.

Descriptions in this specification are merely exemplary, and are not intended to limit the scope of the claims or application of the disclosure in any sense.

Advantageous Effects of Invention

According to a technique of the disclosure, it is possible to perform automatic focus adjustment on a sample having regions with different heights.

BRIEF DESCRIPTION OF DRAWINGS

FIG. 1 is a diagram showing a basic configuration example of a charged particle beam device 101 according to an embodiment.

FIG. 2 is a diagram showing a basic configuration example of a charged particle beam device control software 112a according to the present embodiment.

FIG. 3 is a flowchart showing an automatic focus adjustment function according to the present embodiment.

FIG. 4 is a diagram showing a selection screen of an automatic focus adjustment function based on height information map.

FIGS. 5A to 5E are diagrams showing an execution form (example) of the automatic focus adjustment function based on the height information map.

FIGS. 6A to 6D are diagrams showing an execution form (example) of the automatic focus adjustment function based on the height information map.

FIG. 7 is a flowchart showing the automatic focus adjustment function when an automatic adjustment function is selected first.

FIGS. 8A to 8E are diagrams showing an example of an automatic focus adjustment function that can be executed in a configuration including a stage inclination mechanism 110t.

DESCRIPTION OF EMBODIMENTS

Hereinafter, embodiments of the disclosure will be described with reference to the accompanying drawings. In the accompanying drawings, elements with the same functions may be denoted by the same number. The accompanying drawings show specific embodiments and implementation examples consistent with principles of the disclosure, and are for understanding of the disclosure and are not intended to be construed in a limiting sense.

It is necessary to understand that the embodiments are described in sufficient detail for those skilled in the art to perform the disclosure, other implementations and aspects are possible, and a configuration and a structure can be changed and various elements can be replaced without departing from the scope or the spirit of the technical idea of the disclosure. Therefore, the following description should not be construed as being limited to the embodiments.

As will be described below, the embodiments of the disclosure may be implemented by software running on a general-purpose computer, and may be implemented by dedicated hardware or a combination of software and hardware.

<Basic Configuration Example of Charged Particle Beam Device>

FIG. 1 is a diagram showing a basic configuration example of a charged particle beam device 101 according to an embodiment. The charged particle beam device 101 includes, for example, a charged particle gun 102, a charged particle beam column 103, an objective lens 104, a control circuit 105, a detector 106, an optical camera 107, a sample 108, a sample holder 109, a stage 110, a sample chamber 111, a computer 112 that controls these components, and a monitor 113.

The charged particle beam device 101 shown in FIG. 1 is a device that performs observation and processing by irradiating, with a charged particle beam, the sample 108 disposed in the sample chamber 111 from an internal space of the charged particle beam column 103. A configuration of the charged particle beam device 101 is not limited thereto, and other lenses, detectors, and the like may be mounted on the charged particle beam device 101. Focus adjustment of the charged particle beam device 101 can be performed by changing excitation of the objective lens 104 or changing a position of the stage 110.

The stage 110 includes an XY-axis drive mechanism that drives the sample in a horizontal plane direction (XY direction) with respect to a device installation surface, and a Z drive mechanism that drives the sample in a height direction (Z direction). In addition, the stage 110 may include an R drive mechanism that drives the sample in a rotation direction or a T drive mechanism that drives the sample in an inclination direction. The sample holder 109 and the sample 108 attached to the stage 110 in the sample chamber 111 can be moved by these drive mechanisms. Accordingly, it is possible to move to any field of view specified by a user and perform observation. In addition, not only horizontal movement but also rotation or inclination by the R drive mechanism or the T drive mechanism can be performed to generate a stereo image to be described later.

<Basic Configuration Example of Charged Particle Beam Device Control Software>

FIG. 2 is a diagram showing a basic configuration example of a charged particle beam device control software 112a according to the present embodiment. The software 112a is stored in, for example, a memory (not shown) of the computer 112, reads each program from the memory when a processor (not shown) of the computer 112 executes each function, and loads the program in an internal memory of the processor to implement each function.

The charged particle beam device control software 112a includes, for example, a main routine 200 for observing, photographing, and analyzing a general charged particle image, a stage control routine 201 for controlling an operation of the stage 110, an optical camera control routine 202 for controlling an operation of the optical camera 107, a signal processing routine 203 for generating a height map and a focus value map to be described later, a height map storage region 204, a focus control routine 205, an image display routine 206, and a focus value map storage region 207.

The stage drive mechanism is controlled by the stage control routine 201. In addition, the stage control routine 201 has a function of linking stage coordinates of the stage 110 with a field of view (associating coordinates of an optical image with an image obtained by the charged particle beam device).

The focus adjustment is controlled by the focus control routine 205. The optical image captured by the optical camera 107 controlled by the optical camera control routine 202 is processed by the signal processing routine 203. The generated height map is stored in the height map storage region 204, and the generated focus value map is stored in the focus value map storage region 207. Information processed by the computer 112 is output to the monitor 113 and can be confirmed by the user. The configuration of the charged particle beam device control software 112a may also have other functions, and is not limited thereto.

<Automatic Focus Adjustment Function>

FIG. 3 is a flowchart showing an automatic focus adjustment function according to the present embodiment. The automatic focus adjustment function generally includes a function of generating a height information map based on an optical stereo image of the sample, a function of generating the focus value map based on the height information map, and a function of automatically adjusting a focus based on the focus value map and executing observation and the like.

(i) Step 101

The charged particle beam device 101 is started.

(ii) Step 102

The computer 112 (the processor of the computer 112) detects that the sample holder 109 in which the sample 108 is set is attached to the stage 110 of the sample chamber 111 by the user (operator). Specifically, after the sample holder 109 is attached to the stage 110, the user notifies the computer of the completion of the attachment (for example, click an attachment completion button on the UI).

(iii) Step 103

The observation sample 108 is imaged by the optical camera 107, and an optical image is captured. Specifically, for example, when the attachment of the sample holder 109 to the stage 110 is completed, a selection screen 301 (see FIG. 4) of the automatic focus adjustment function based on the height information map is automatically opened (for example, pop-up display).

The selection screen 301 for automatic focus adjustment based on the height information map includes an automatic focus adjustment function setting button 302 for setting whether to use the automatic focus adjustment function, an objective lens adjustment selection button 303 for setting whether to adjust a focus by an objective lens, a working distance setting button 304, a stage height adjustment selection button 305 for setting whether to adjust the focus by vertical movement of a stage height, an image display unit 306 for displaying the optical image and the charged particle image, an optical image capturing button 307, a height map generation button 308, a stereo image generation button 309, and a focus value map generation button 310. Here, the working distance (WD) indicates a distance between a lower surface of the objective lens 104 and the sample 108. As for the adjustment of the focus, the user can freely select both of changing of the WD by moving the stage 110 in an upper-lower direction and adjusting of the focus by the objective lens while keeping the WD constant. Further, it is possible to set the WD to any value desired by the user, and to perform focus adjustment and observe the WD at a constant value.

In this step, the user clicks the optical image capturing button 307 to capture an optical image by the optical camera 107. The user may specify a target position (position on the sample 108) for optical imaging in advance, automatically start the optical imaging, and obtain the optical image. The optical image obtained by imaging is displayed on the image display unit (image display region) 308, and can be superimposed on the charged particle image.

(iv) Step 104

When the user clicks the stereo image generation button 309 on the selection screen 301 for the automatic focus adjustment, the processor of the computer 112 generates a stereo image by the signal processing routine 203 based on the optical image captured in step 103.

(v) Step 105

When the user clicks the height map generation button 308 on the selection screen 301 for the automatic focus adjustment, the processor generates a height information map of the sample 108 (combination information of each coordinate value on the sample 108 and a height at the position) based on the stereo image generated in step 104. A height at specific coordinates can be calculated, for example, by estimating a distance from a stereo image (including two images obtained at different angles) to coordinates of a target using a parallax method. The parallax method is introduced as a stereo vision method in paragraphs [0002] and [0003] of WO 2018/043437.

The generated height information map is linked to the stage coordinates and stored in the height map storage region 204 in association with the observation field of view.

(vi) Step 106

When the user clicks the focus value map generation button 310 on the selection screen 301 for the automatic focus adjustment, the processor generates a focus value map in each region of the sample 108 based on the height information map of the sample 108 generated in step 104. A relative focus value of each point of the sample 108 is calculated in advance together with an offset (for example, when coordinates having the largest height is set as a reference point, the height of the reference point is set as an offset, and a difference value from the focus value of the reference point is set as a relative focus value), and thus the relative focus value is linked to stage coordinates and stored in the focus value map storage region 207.

(vii) Step 107

The processor determines whether the automatic focus adjustment function setting button 302 on the selection screen 301 for the automatic focus adjustment is selected (checked). At this time, the user is required to select a focus adjustment control method by clicking either the objective lens adjustment selection button 303 or the stage height adjustment selection button 305. When the objective lens adjustment is selected, the user freely selects the WD by the WD setting button 304. When the automatic focus adjustment function setting button 302 is not checked (No in step 107), the processing proceeds to step 108. When the automatic focus adjustment function setting button 302 is checked (Yes in step 107), the processing proceeds to step 109.

(viii) Step 108

The user performs normal focus adjustment. Here, "normal focus adjustment" is a method in which the user manually adjusts the focus each time the observation field of view is moved. Although omitted in the present specification, in a configuration in which a scanning transmission electron microscope image observation function is also added, since the sample 108 is processed into a thin film having a substantially uniform height and the user often manually adjusts a defocus amount to perform imaging, this branch may be provided.

(ix) Step 109

The user freely moves the field of view (can move the observation field of view to any coordinate position desired to be observed on the sample 108). This movement of the field of view is executed by driving the stage 110 to which the sample 108 is attached while controlling the stage 110 by the stage control routine 201. Here, the user can freely input a movement amount of the field of view using a mouse, a trackball, a joystick, and the like (not shown).

(x) Step 110

The processor automatically adjusts the focus based on the focus value map generated in step 106, following the movement of the field of view performed in step 109. If the automatic focus adjustment function is set by the above procedure, the user can omit the manual focus adjustment.

(xi) Step 111

The processor allows the user to freely execute functions such as observation, capturing, and analysis of a general charged particle image based on the main routine 200. At this time, since the user does not need to adjust the focus, operation time is remarkably reduced.

(xii) Step S112

The processor determines whether the movement of the field of view is continued. When the movement of the field of view is continued (Yes in step 112), the processing proceeds to step 109, and the processing from step 109 to step 111 are repeated again. When the movement of the field of view ends (No in step 112, for example, when an instruction to end the processing is input by the user, or when the obtaining and analysis of electron images for all coordinates to be observed are completed), the processing ends in step 113.

<Modification of Automatic Focus Adjustment Function>

In the description of FIG. 3, a method is shown in which the buttons for the steps shown in FIG. 4 are provided and the steps are executed in a stepwise manner. However, after the sample 108 is set in step 102, it is determined whether the automatic adjustment function is selected by the automatic focus adjustment function setting button 302 on the selection screen 301 for the automatic focus adjustment. When the automatic adjustment function is selected, step 103 to step 106 may be automatically executed. FIG. 7 is a flowchart showing the automatic focus adjustment function when the automatic adjustment function is selected first.

<Modification of Generation of Height Information Map>

In step 103 to step 105 of FIG. 3, the height information map is generated based on the stereo image generated by imaging the sample 108 using the optical camera 107. Alternatively, the invention is not limited to this method, and the height information map of the sample can be generated by obtaining the height information in each region (each coordinate position) of the sample 108 using a laser interferometer instead of the optical camera 107. In this case, the focus value map is calculated based on the height information map of the sample 108 obtained from the laser interferometer, and the focus is automatically adjusted following the movement of the field of view.

<Execution Form of Automatic Focus Adjustment Function>

FIGS. 5 and 6 are diagrams showing an execution form (example) of the automatic focus adjustment function based on the height information map.

(i) First, the user sets the sample 108 in the sample holder 109 (see FIG. 5(a)).

(ii) Next, the field of view is moved, and two images are captured by the optical camera (see FIG. 5(b)). At this time, the stage 110 or the optical camera 107 is moved in the left-right XY direction to capture at least two optical images of the sample 108.

(iii) A stereo image is generated based on the obtained two images, and height information of the sample 108 is calculated to generate the height information map (see FIGS. 5(c) and 6(a)).

(iv) Based on the height information map, the focus value map in each region (each coordinate) of the sample 108 is generated (see FIGS. 5(d) and 6(b). Here, as shown in FIG. 6(c), the user can observe any first observation field of view. In addition, the focus of the first observation field of view freely selected here can be automatically adjusted based on the focus value map.

(v) When the field of view having a different height is moved, the focus also follows and is automatically adjusted (FIG. 5(e) and FIG. 6(d)). Here, the focus to be automatically adjusted is executed with reference to the focus value map of each region generated in (iv). As shown in FIG. 5(e), it is possible to adjust a focus value F by linking the stage coordinates with the movement of the stage such that the focus value F=α or the focus value F=β. Here, the charged particle beam from the charged particle beam column 103 is emitted to the sample 108 disposed in the sample chamber 111 to perform observation, and observation can be performed by detecting a brightness signal of a charged particle beam image using the detector 106.

<Example of Automatic Focus Adjustment Using Image in Which Sample is Inclined>

FIG. 8 is a diagram showing an example of an automatic focus adjustment function that can be executed in a configuration including a stage inclination mechanism 110t. In this case, XY coordinates may be determined by an optical image having an inclination of 0°, and then a map of the sample 108 in the Z direction may be generated based on two optical images captured by inclining the sample (for example, an optical image captured by inclining the sample 108 by +3° and an optical image captured by inclining the sample 108 by −3°), and may be used as the focus value map.

<Summary>

According to the charged particle beam device of the present embodiment, the height information of the sample is calculated based on the optical image obtained by imaging the sample by the optical imaging device, or the height information measured by the laser interferometer is measured, and the setting of the focus adjustment value of the observation site is automatically executed based on the height information. Accordingly, when the user observes a large sample having sites (regions) with different heights, the user can automatically adjust the focus regardless of the observation field of view to which the user moves. Since the focus is automatically adjusted following the movement of the field of view, the user can always observe with an optimum focus without adjusting the focus. In addition, since observation time can be shortened, efficiency of the operation and usability can be improved. Further, since the user does not need to perform the focus adjustment, a user who is unfamiliar with the operation of the charged particle beam device can easily handle the device.

REFERENCE SIGNS LIST

101: charged particle beam device
102: charged particle gun
103: charged particle beam column
104: objective lens
105: control circuit
106: detector
107: optical camera
108: sample
109: sample holder
110: stage
110t: stage inclination mechanism
111: sample chamber
112: computer
113: monitor
112a: charged particle beam device control software
200: main routine
201: stage control routine
202: optical camera control routine
203: signal processing routine
204: height map storage region
205: focus control routine
206: image display routine
207: focus value map storage region
301: selection screen for automatic focus adjustment function based on height information map
302: automatic focus adjustment function setting button
303: objective lens adjustment selection button
304: working distance setting button
305: stage height adjustment selection button
306: image display unit
307: optical image capturing button
308: height map generation button
309: stereo image generation button
310: focus value map generation button

The invention claimed is:

1. A charged particle beam device comprising:
a sample holder configured to hold a sample;
a sample stage configured to move the sample;
a charged particle gun and a charged particle beam column configured to irradiate the sample with a charged particle beam;
an objective lens configured to perform focus adjustment by changing an intensity of a focusing effect on the charged particle beam;
a detector configured to detect electrons from the sample and output a signal forming an electron image;
an optical imaging device configured to capture an optical image of the sample; and
a control device configured to generate a stereo image based on at least two optical images of the sample captured by the optical imaging device, generate a height information map of the sample based on the stereo image, and automatically set a focus adjustment value of an observation site based on the height information map.

2. The charged particle beam device according to claim 1, wherein
the control device is configured to irradiate the observation site of the sample with the charged particle beam according to the set focus adjustment value, form the electron image, and output the electron image.

3. The charged particle beam device according to claim 1, wherein
the control device is configured to generate the height information map of the sample based on the stereo image obtained from at least two optical images captured by the optical imaging device while moving the sample in a horizontal direction.

4. The charged particle beam device according to claim 1, wherein
the sample stage includes a stage inclination mechanism, and
the control device is configured to generate the height information map of the sample based on the stereo image from at least two optical images having different sample inclination angles.

5. The charged particle beam device according to claim 1, wherein
the control device is configured to generate a focus value map of the sample by setting a reference point in the height information map of the sample and calculating an offset value, which indicates a height position of the reference point, and a focus value relative to the reference point in each region of the sample.

6. The charged particle beam device according to claim 5, wherein
the control device is configured to follow movement of an observation field of view by movement of the sample stage and execute automatic focus adjustment based on the focus value map of the sample.

7. The charged particle beam device according to claim 1, wherein
the sample stage includes a drive mechanism in at least xyz three-axis directions, and
the control device is configured to link the height information and a focus value with coordinates of the sample stage.

8. The charged particle beam device according to claim 1, wherein
the control device is configured to display on a screen of a display device a user interface for setting a condition of automatic focus adjustment based on the height information.

9. The charged particle beam device according to claim 8, wherein
the user interface includes a selection field configured to select adjustment by the objective lens or adjustment by the sample stage for the automatic focus adjustment, and a setting field setting a working distance of the objective lens, and
the control device is configured to execute the automatic focus adjustment while keeping the working distance of the objective lens constant.

10. The charged particle beam device according to claim 8, wherein
the user interface includes an image display field in which the optical image captured by the optical imaging device and the electron image are displayed in a superimposed manner.

11. A focus adjustment method for automatically adjusting a focus on a sample placed on a charged particle beam device, the focus adjustment method comprising:
obtaining, by a control device that controls an operation of the charged particle beam device, at least two optical images of the sample obtained by an optical imaging device and generating a stereo image;
generating, by the control device, a height information map of the sample based on the stereo image;
setting, by the control device, a focus adjustment value of an observation site of the sample based on the height information map; and
controlling, by the control device, a focus of the charged particle beam device based on the focus adjustment value.

* * * * *